United States Patent [19]
Kawashima et al.

[11] 3,992,660
[45] Nov. 16, 1976

[54] FREQUENCY-CURRENT CONVERSION CIRCUIT

[75] Inventors: Yoshichi Kawashima, Gifu; Hiroiku Masuda, Aichi; Hisami Mitsueda, Toyota, all of Japan

[73] Assignee: Nippondenso Co., Ltd., Aichi, Japan

[22] Filed: Jan. 17, 1975

[21] Appl. No.: 542,002

[30] Foreign Application Priority Data
Jan. 18, 1974    Japan.................................. 49-8715

[52] U.S. Cl. ............................... 321/6; 307/233 A;
307/246; 307/271; 324/78 J; 328/140
[51] Int. Cl.² ...................... H03B 3/04; H02M 7/00
[58] Field of Search ............. 321/6, 18; 307/233 A,
307/246, 261, 271; 328/140; 324/78 J; 320/1

[56] References Cited
UNITED STATES PATENTS

| | | | |
|---|---|---|---|
| 3,535,658 | 10/1970 | Webb................................. | 328/140 |
| 3,575,611 | 4/1971 | Reed................................. | 324/78 J |
| 3,584,298 | 6/1971 | Kolblaz............................. | 307/233 A |
| 3,590,379 | 6/1971 | Fellerman et al.................. | 324/78 J |
| 3,628,063 | 12/1971 | Tamari.............................. | 307/261 |
| 3,749,938 | 7/1973 | Van Winkler...................... | 307/261 |

Primary Examiner—Gerald Goldberg
Attorney, Agent, or Firm—Cushman, Darby & Cushman

[57] ABSTRACT

A frequency-current conversion circuit adapted to a speedometer installed in a vehicle for converting the rate of rotation of an engine to a current signal wherein a first capacitor is charged to a predetermined value during the half cycle of an input signal and, then, a second capacitor is charged with the electric charge stored in the first capacitor during the half cycle of the input signal following the half cycle where the first capacitor is charged. When a voltage across the first capacitor reaches a predetermined value, the second capacitor stops charging. The smoothed direct current signal from the second capacitor, if necessary amplified by a current amplifier, drives a load.

7 Claims, 7 Drawing Figures

León 3,992,660

FREQUENCY-CURRENT CONVERSION CIRCUIT

BACKGROUND OF THE INVENTION

Typical types of conventional frequency-current conversion circuits are shown in FIG. 1 and FIG. 2. In the frequency-current conversion circuit shown in FIG. 1, a capacitor 38 is charged to a predetermined value during the half cycle of a square-shaped input pulse signal having frequency proportional to the rate of rotation of the engine, and then capacitor 38 is discharged to drive an ammeter 27 during the next half cycle. The wave form of the current flowing through the ammeter 27 is shown in FIG. 5, in which the ordinate $I_M$ represents the current flowing through the ammeter, the abscissa t represents the time, and T represents one cycle interval of the input signal.

In the circuit shown in FIG. 2, a monostable multivibrator generates an output which is a series of voltage pulses, each of which is synchronized with a series of square-shaped pulses and has a uniform pulse width. An ammeter 27 is driven by the output of the monostable multivibrator. The wave form of the current flowing through the ammeter 27 is shown in FIG. 6. Since the output current signal of each circuits shown in FIG. 1 and FIG. 2 is a series of pulses, the pointer of the ammeter indicating the rate of rotation vibrates when the frequency of the output current signal is extremely low. Moreover in the circuit shown in FIG. 1, since the pulse width of the output current depends on a time constant determined by the capacitance of a capacitor 38 and the internal resistance of the ammeter 27, the charge of the capacitor 38 begins anew before the completion of the discharge of the capacitor 38 when the rate of rotation of the engine rises. Therefore the circuit cannot avoid the occurrence of an error in the indication of the ammeter 27. In the circuit shown in FIG. 2, an output is a series of voltage pulses. Therefor when the internal resistance of the ammeter 27 varies in accordance with the ambient temperature, the current flowing through the ammeter 27 also varies, causing an error in the indication of the ammeter 27. For this reason a temperature compensation circuit is a necessity for this circuit.

SUMMARY OF THE INVENTION

To overcome the foregoing disadvantages, it is an object of the present invention to provide a frequency-current conversion circuit which does not require temperature compensation.

It is another object of the present invention to provide a frequency-current conversion circuit which, for the high frequency range of an input signal, produces little error in the indication of an ammeter, and for the low frequency range of the input, decreases ripples existing in a current flowing through the ammeter to prevent the vibration of a pointer of the ammeter.

It is further object of the present invention to provide a frequency-current conversion circuit which is able to drive a large load by means of a current amplification circuit which amplifies a current flowing from a second capacitor to a level sufficient to drive the load.

This invention also provides a new method for converting frequency into current.

DESCRIPTION OF THE PREFERRED EMBODIMENTS

Figure 1:
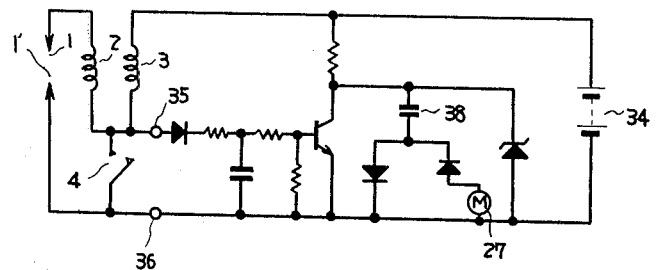
FIG. 1 and FIG. 2 are electrical circuit diagrams showing two conventional types of frequency-current conversion circuit.
Figure 2:
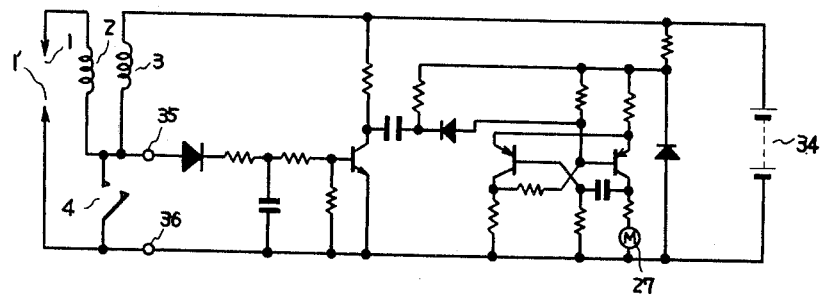
Figure 3:
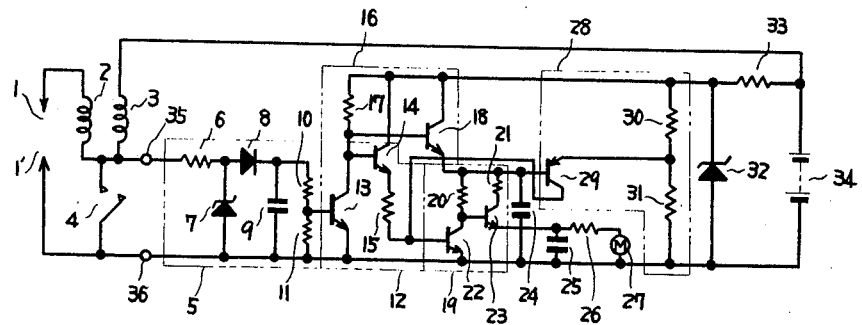
FIG. 3 is an electric circuit diagram showing a first embodiment of the present invention.

The present invention will now be described with reference to the first embodiment illustrated in FIG. 3. In FIG. 3, numeral 1 designates a center electrode of a spark plug, numeral 1' a ground electrode of the spark plug, and sparks are produced between the center electrode 1 and the ground electrode 1'. Numeral 2 designates a boost coil, numeral 3 a primary coil, numeral 4 a contact breaker for producing an intermittent current flowing through the primary coil 3. Numeral 5 designates an input detection circuit consisting of a resistor 6, a zener diode 7, a diode 8, a capacitor 9 and resistors 10 and 11. Numeral 12 designates a change-over circuit consisting of transistors 13, 14 and a resistor 15. The change-over circuit 12 activates a first switching circuit 16 and a second switching circuit 19 alternately in accordance with the input signal for charging a first capacitor 24 and a second capacitor 25. The first switching circuit 16 consisting of a resistor 17 and a transistor 18 charges the first capacitor 24 to a predetermined electric potential value. The second switching circuit 19 consisting of resistors 20, 21 and transistors 22, 23 transfers the electric charge stored in the first capacitor 24 to the second capacitor 25 until the electric potential of the first capacitor 24 decreases under a predetermined value. Numeral 26 designates a resistor, numeral 27 an ammeter operating as a load. Numeral 28 designates a voltage detection circuit consisting of a transistor 29 and resistors 30, 31. The voltage detection circuit 28 detects whether the electric potential of the first capacitor 24 is below a predetermined value or not. The input detection circuit 5, the change-over circuit 12, the first switching circuit 16, the second switching circuit 19 and the voltage detection circuit 28 constitute a control circuit. Numeral 32 designates a zener diode, numeral 33 a resistor, numeral 34 a battery, numeral 35, 36 are terminals for receiving an input signal.

With the construction described above, a frequency-current conversion circuit of the present invention operates as follows. When the contact breaker 4 is opened and closed according to the rotation of the engine, a battery voltage and a zero voltage develops alternately between the terminals 35, 36. Simultaneously high voltages develop across the boost coil 2, producing sparks between the center electrode 1 and the ground electrode 1'. While sparking a high frequency noise generates and appears on the square-shaped input signal composed of the battery voltage and the zero voltage, deforming the input signal applied to the terminals 35, 36. The input detection circuit 5 eliminates the high frequency noise lying on the input signal. The transistor 13 becomes conductive and non-conductive in accordance with the signal applied to the base thereof, generating a square-shaped signal at the collector thereof. The transistor 13 becomes conductive during the half cycle when the input signal is battery voltage, and becomes non-conductive during the half cycle when the input signal is zero voltage. When the transistor 13 becomes non-conductive, the transistors 14, 18 become conductive, and the first capacitor 24 is charged through the transistor 18 to the voltage value $V_z - V_{BE18}$, that is, the voltage lower than the zener voltage $V_z$ of the zener diode 32 by the forward drop voltage $V_{BE18}$ of the transistor 18. On the other hand, since the transistor 22 also becomes conductive, the transistor 23 becomes non-conductive forming no closed circuit for discharging the electric charge stored in the first capacitor 24 to the second capacitor 25. When the transistor 13 becomes conductive, the transistors 14, 18, 22 become non-conductive, and the transistor 23 becomes conductive being supplied power from the first capacitor 24 in charged state. Therefore some of the electric charge stored in the first capacitor 24 are released to the second capacitor 25 through the transistor 23 in conductive state. When the voltage across the first capacitor 24 drops under a certain value, the transistor 29 becomes conductive, rendering the transistor 22 conductive. Consequently, the transistor 23 becomes non-conductive to stop charging the second capacitor 25. The emitter voltage of the transistor 29 designated Vo is determined by the resistors 30, 31 which construct a voltage divider. Accordingly, the second capacitor 25 stops charging when the voltage across the first capacitor 24 decreases under $V_o - V_{BE29}$, that is, the voltage lower than the voltage Vo by the base-emitter voltage $V_{BE29}$ of the transistor 29. The electric charge stored in the second capacitor 25 produces an electric current flowing through the ammeter 27 which indicates the electric current value corresponding to the frequency of the input signal. Since $V_{BE18} \approx V_{BE29}$ holds, the electric charge stored in the second capacitor 25 in one cycle of the input signal equals $$\{(V_z - V_{BE18}) - (V_o - V_{BE29})\} C_1 = (V_z - V_o) C_1$$

, where $C_1$ designates the capacitance of the first capacitor 24. Accordingly a means value of the current I flowing through the ammeter 27 becomes $$I = \frac{(V_z - V_o) C_1}{T} = (V_z - V_o) C_1 \cdot f$$

, where T designates a time period of the input signal, $f$ a frequency of the input signal. Since $V_z$, $V_o$, $C_1$ are constant, it is apparent that the amount of the output current produced from the second capacitor 25 to flow through the ammeter 27 is proportional to the frequency of the input signal. If the circuit constants are selected so as to satisfy a following inequality (a), errors will not be produced in high frequency range of the input signal, and ripples will diminish in the low frequency range thereby to reduce the vibration of the pointer of the ammeter.

$$C_1 r_{33}, C_1 r_{21} \ll T \min < T \max \ll C_2(r_{26} + r_{27}) \quad (a)$$

Figure 7:
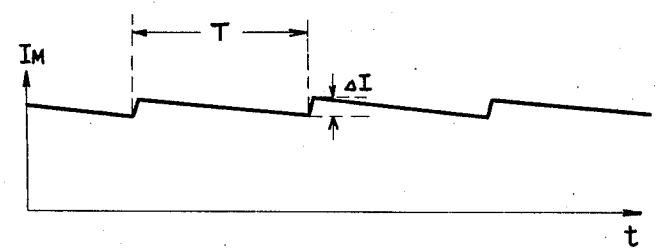

, where $r_{21}$ designates the resistance value of the resistor 21, $C_1 r_{21}$ designates the discharging time constant of the first capacitor 24, $r_{33}$ the resistance value of the resistor 33, $C_1 r_{33}$ the charging time constant of the first capacitor 24, $r_{26}$ and $r_{27}$ the resistance value of the resistor 26 and the internal resistance value of the ammeter 27 respectively, $C_2$ the capacitance of the capacitor 25, $C_2(r_{26} + r_{27})$ the discharging time constant for the second capacitor 25, T max and T min a maximum and a minimum time period of the input signal respectively. The wave form of the electric current flowing through the ammeter 27 is shown in FIG. 7. In FIG. 7 ΔI designates a ripple current. Since a frequency-current conversion circuit of the present invention produces the electric current proportional to the frequency of the input signal independently of the resistance value of a load as described above, the electric current flowing through the ammeter 27 is unchangeable even if the resistance value of the resistor 26 or the internal resistance value of the ammeter 27 change in accordance with the ambient temperature. Consequently, it is not necessary for the embodiment of the present invention to be compensated for temperature. Besides, since the charging and the discharging time constants of the capacitor 24 can be selected independently of the internal resistance value $r_{27}$, the condition given by the inequality (a) can be realized easily in the present invention.

Figure 4:
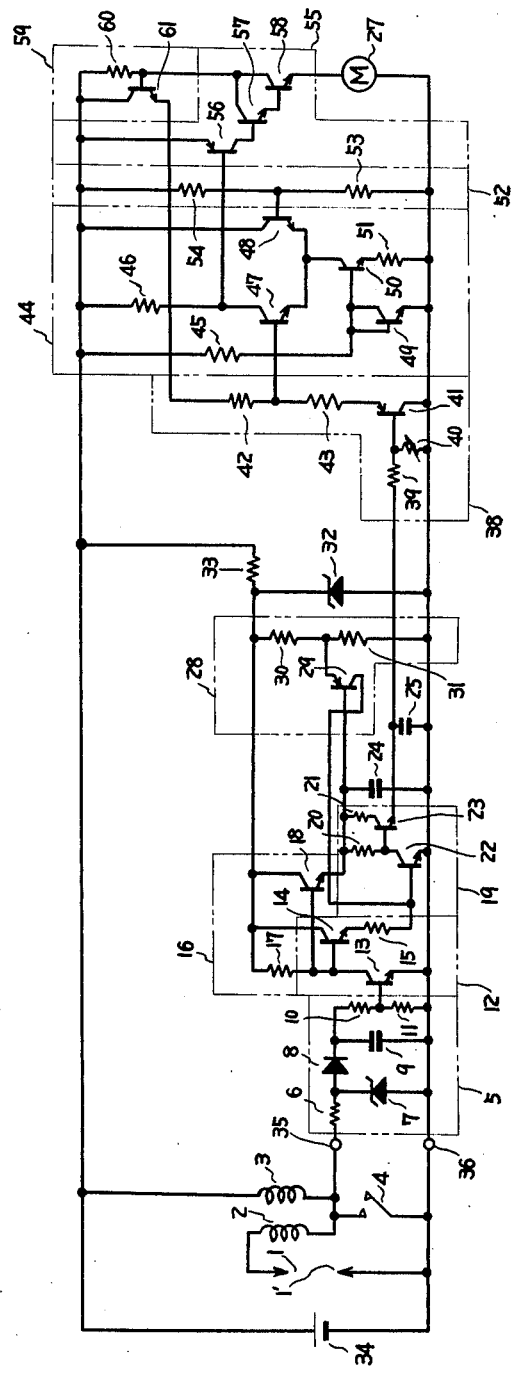
FIG. 4 is an electric circuit diagram showing a second embodiment.
Figure 5:
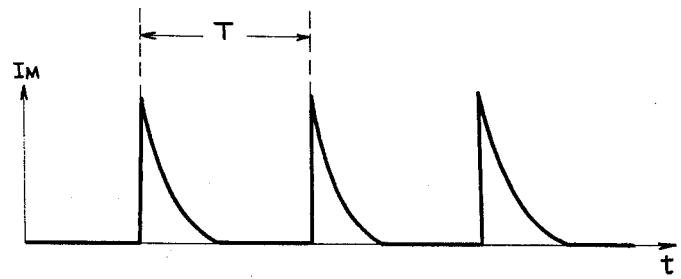
FIG. 5, FIG. 6 and FIG. 7 are characteristic diagrams illustrating the wave form of the electric current flowing through the ammeter employed in the circuit shown in FIG. 1, FIG. 2 and FIG. 3 respectively.
Figure 6:
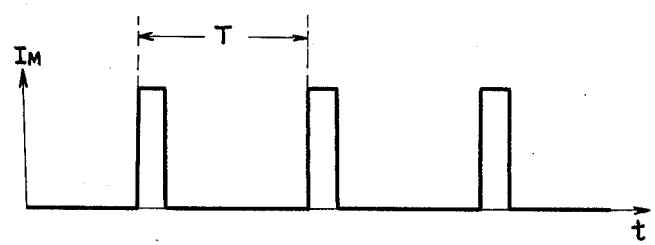

A second embodiment of the present invention shown in FIG. 4 is characterized by having a current amplification circuit for driving larger load in addition to the same construction as the first embodiment. Referring to FIG. 4, numerals 1~25, 27~36 designate the same elements as of the first embodiment shown in FIG. 3. Numeral 38 designates a current-voltage conversion circuit consisting of resistors 39, 40, 42, 43 and a transistor 41. Numeral 44 designates a differential amplification circuit consisting of resistors 45, 46, 51 and transistors 47, 48, 49, 50. Numeral 52 designates a standard voltage generation circuit consisting of resistors 53, 54. Numeral 55 designates a direct-current amplification circuit consisting of transistors 56, 57, 58. Numeral 59 designates a load current detection circuit consisting of a resistor 60 and a transistor 61. The current-voltage conversion circuit 38, the differential amplification circuit 44, the standard voltage generation circuit 52, the direct current amplification circuit 55 and the load current detection circuit 59 constitute a current amplification circuit.

The frequency-current conversion circuit shown in FIG. 4 generates a current flowing through the resistor 40 in proportion to the rate of rotation of the engine based on the same operation as the first embodiment of the present invention. Then a voltage proportional to the rate of rotation of the engine appears across the resistor 40, biasing the base of the transistor 41. Accordingly, the voltage developing on the emitter of the transistor 41 becomes to be higher than the base voltage of the transistor 41 by the amount of the base-emitter voltage drop of the transistor 41. On the other hand, a load current to the ammeter 27 flows through the resistor 60, generating a voltage drop proportional to the load current across the resistor 60. Therefore, the emitter voltage of the transistor 61 is equal to the voltage subtracting a voltage drop across the resistor 60 and a voltage drop between the base and the emitter of the transistor 61 from the battery voltage. A voltage difference between the emitter voltages of the transistors 61 and 41 is divided by the resistors 42 and 43, generating a reference voltage at the juncture of the resistor 42 and the resistor 43, which is applied to the base of the transistor 47. At the same time the transistor 48 receives at its base a standard voltage determined by the voltage divider composed of the resistors 53 and 54. A voltage difference between the standard voltage and the reference voltage is amplified in the differential amplification circuit 44, generating at the collector of the transistor 47 an output voltage, which is applied to the base of the transistor 56. Being controlled by the voltage applied to the base of the transistor 56, the direct-current amplification circuit 55 operates and supplies the load current proportional to the rate of rotation of the engine to the ammeter 27.

In the first embodiment of the present invention shown in FIG. 3, if the resistor 26 connected in parallel to the second capacitor 25 is a resistor having fixed-resistance value, the voltage developing across the resistor 26 becomes proportional to the frequency of the input pulse signal applied to the terminals 35, 36. Consequently it is possible to use a frequency-current conversion circuit of the present invention as a frequency-voltage conversion circuit.

What is claimed is:

1. A frequency-current conversion circuit comprising:
   a pair of terminals for receiving an alternating input signal;
   a first capacitor;
   a second capacitor;
   a control circuit, connected to said terminals and each of said first capacitor and said second capacitor, for charging said first capacitor to a first predetermined value during a half cycle of an input signal, and charging said second capacitor with the electric charge stored in said first capacitor until the charged potential of said first capacitor decreases to a second predetermined value, during a half cycle of said input signal following the half cycle of said input signal during which said first capacitor is charged, thereby controlling said electric charge for charging said second capacitor so that said charge for said second capacitor is constant and generating an output voltage across said second capacitor for supplying output current proportional to the frequency of said input signal to a load.

2. A frequency-current conversion circuit as claimed in claim 1, wherein said control circuit comprises:
   an input detection circuit for detecting said input signal;
   a change-over circuit connected to said input detection circuit for generating a control signal synchronized with the frequency of said input signal;
   a first switching circuit connected to said change-over circuit and to said first capacitor for charging said first capacitor in accordance with the control signal of said change-over circuit to a first predetermined value in the half cycle of said input signal;
   a second switching circuit, connected to said change-over circuit, said first capacitor and said second capacitor for charging said second capacitor in accordance with the control signal of said change-over circuit with the electric charge stored in said first capacitor in a half cycle of said input signal following the half cycle of said input signal during which said first capacitor is charged;
   a voltage detection circuit connected to said second switching circuit and said first capacitor for stopping the operation of said second switching circuit when the charging potential of said first capacitor decreases to said second predetermined value.

3. A frequency-current conversion circuit as claimed in claim 2 further comprises:
   a current amplification circuit connected to said second capacitor for amplifying said output current flowing from said second capacitor.

4. A frequency-current conversion circuit as claimed in claim 3, wherein said current amplification circuit comprises:
   a current-voltage conversion circuit connected to said second capacitor for generating an output voltage in accordance with said output current flowing from said second capacitor;
   a standard voltage generation circuit for generating a standard voltage;
   a differential amplification circuit connected to said standard voltage generation circuit and said current-voltage conversion circuit for generating an output voltage proportional to the voltage difference between said standard voltage produced from said standard voltage generation circuit and said output voltage produced from said current-voltage conversion circuit;
   a direct-current amplification circuit connected to said differential amplification circuit for supplying a load current to a load in accordance with said output voltage produced from said differential amplification circuit; and
   a load current detection circuit connected to said direct-current amplification circuit and said current-voltage conversion circuit for compensating said output voltage produced from said current-voltage conversion circuit to make said load current proportional to said output current flowing from said second capacitor.

5. A frequency-current conversion circuit as claimed in claim 1 further comprises:
   a current amplification circuit connected to said second capacitor for amplifying said output current flowing from said second capacitor.

6. A frequency-current conversion circuit as claimed in claim 5, wherein said current amplification circuit comprises:
   a current-voltage conversion circuit connected to said second capacitor for generating an output voltage in accordance with said output current flowing from said second capacitor;
   a standard voltage generation circuit for generating a standard voltage;
   a differential amplification circuit connected to said standard voltage generation circuit and said current-voltage conversion circuit for generating an output voltage proportional to the voltage difference between said standard voltage produced from said standard voltage generation circuit and said output voltage produced from said current-voltage conversion circuit;
   a direct-current amplification circuit connected to said differential amplification circuit for supplying a load current to said load in accordance with said output voltage produced from said differential amplification circuit; and
   a load current detection circuit connected to said direct-current amplification circuit and said current-voltage conversion circuit for compensating said output voltage produced from said current-voltage conversion circuit to make said load current proportional to said output current flowing from said second capacitor.

7. A method for converting frequency to current comprising the steps of:
   receiving an alternating signal having a frequency;
   generating a first signal during the first half cycle of said alternating signal and a second signal during the second half cycle of said alternating signal following said first half cycle of said alternating signal, said first half cycle and said second half cycle constitute one cycle of said alternating signal;
   storing electric charge in a first certain place while said first signal is being generated;
   releasing said electric charge stored in said first certain place while said second signal is being generated, the amount of said released electric charge being constant;
   storing said constant amount of electric charge released from said first certain place in a second certain place;
   supplying a current to a load in accordance with a voltage developed by the electric charge stored in said second certain place;
   repeatedly storing and releasing said electric charge in and from said first and second certain places so as to supply a current proportional to said frequency of said alternating signal to a load.

* * * * *